United States Patent [19]

Kovats et al.

[11] 4,399,541
[45] Aug. 16, 1983

[54] LIGHT EMITTING DEVICE PACKAGE HAVING COMBINED HEATER/COOLER

[75] Inventors: Tibor F. I. Kovats, Ottawa; Tibor F. Devenyi; Christopher M. Look, both of Nepean, all of Canada

[73] Assignee: Northern Telecom Limited, Quebec, Canada

[21] Appl. No.: 234,676

[22] Filed: Feb. 17, 1981

[51] Int. Cl.³ .............................................. H01S 3/04
[52] U.S. Cl. ........................................... 372/36; 372/6; 372/12; 350/96.14
[58] Field of Search ......................... 372/6, 36; 357/87

[56] References Cited

U.S. PATENT DOCUMENTS 3,296,033  10/1961  Scuro et al. ............................ 357/87

FOREIGN PATENT DOCUMENTS 2721991  11/1978  Fed. Rep. of Germany ..... 350/96.2
2420777  11/1979  France ................................ 350/96.2
54-111778  9/1979  Japan ..................................... 372/36

OTHER PUBLICATIONS

Wittke et al., "Stabilization of CW Injection Lasers," Technical Notes, No. 1005 (RCA) Apr. 1975, Princeton, N.J.

Dufft et al., "A Hermetically Encapsulated AlGaAs Laser Diode," Conference; Proceedings of the 30th Electronic Components Conference, San Francisco, CA. USA, p. 28-30, Apr. 1980.

*Primary Examiner*—William L. Sikes
*Assistant Examiner*—Léon Scott, Jr.
*Attorney, Agent, or Firm*—Stuart L. Wilkinson

[57] ABSTRACT

A known electro-optic has a semiconductor laser, a temperature sensor for controlling an electrically operated cooler, and an optical fiber end portion anchored close to the laser to receive light from it. Usually the fiber is anchored by a mass of cured epoxy. This invention proposes anchoring the fiber in a mass of fusible alloy which is melted and solidified using a Peltier effect device which is driven with one polarity current to function as a heater and with a reverse polarity current to function as a cooler. Once the package is complete and the laser is operating, the temperature sensor together with the Peltier effect device functioning as a cooler are used to cool the laser.

12 Claims, 3 Drawing Figures

U.S. Patent
Aug. 16, 1983
4,399,541
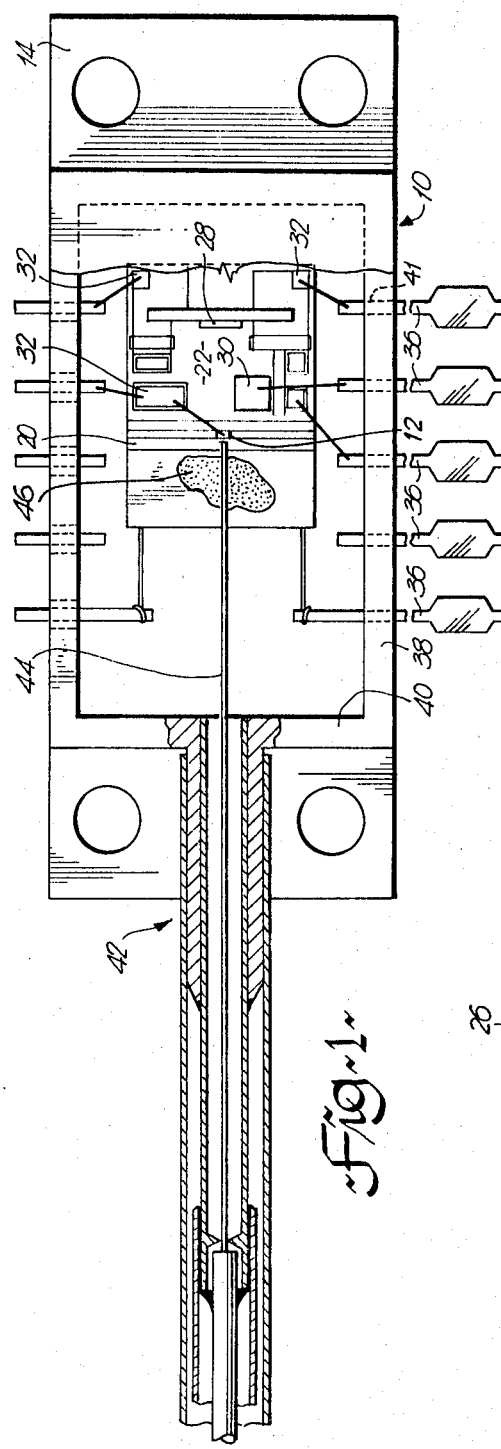
*Fig-1-*
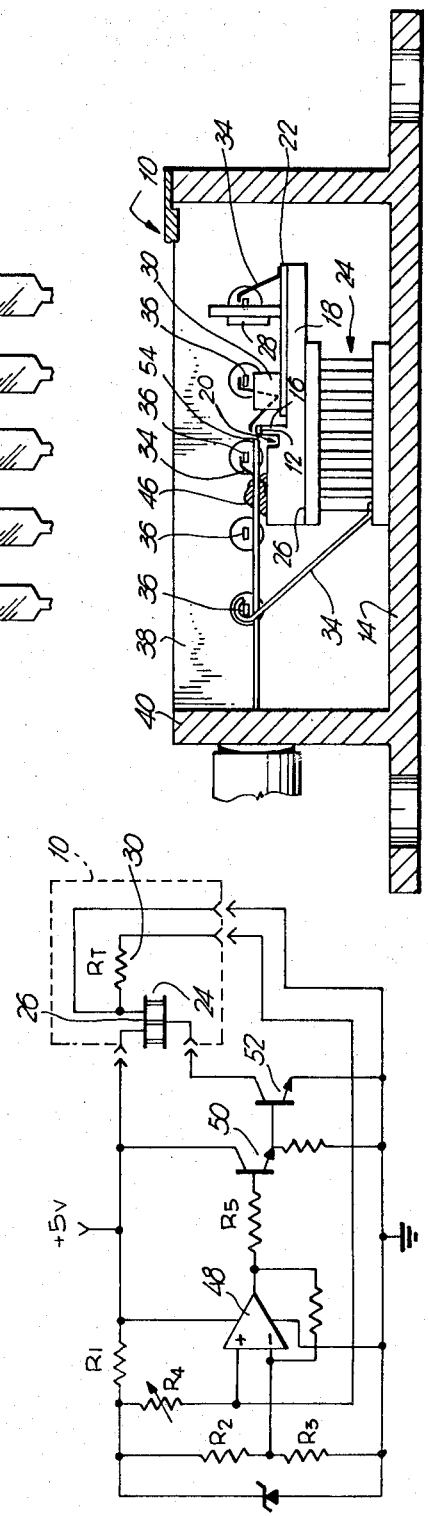
*Fig-2-*
*Fig-3-*

LIGHT EMITTING DEVICE PACKAGE HAVING COMBINED HEATER/COOLER

This invention relates to laser and LED packages for use in fiber optic communication systems. A typical package for use in a fiber optic system basically comprises a laser diode of the double heterostructure type, mounted within a housing. High temperature resulting from normal laser operation both accelerates aging and causes fluctuation of light output. To retard aging, the laser has a heat sink which is mounted upon, and cooled by, a thermoelectric cooler. Also housed within such a package are a temperature sensor for monitoring the temperature of the heat sink and an avalanche photodiode for monitoring output from the laser. Electrical outputs from the sensor and the photodetector control the drive current applied to the cooler and the laser respectively. Leads to electrical elements within the housing are taken through a housing wall at hermetic feedthroughs. In addition, an optical fiber also mounted in a hermetic feedthrough in the housing wall has a bared end portion anchored in a mass of cured epoxy resin in a position and orientation in which the fiber end receives light from the laser front facet.

Epoxy resin is not an ideal material for anchoring an optical fiber. For one thing, the room temperature curing time is long; furthermore, the curing reaction is irreversible. Consequently, to remove the fiber it must be broken out of the cured resin with the attendant risk of leaving detritus on both the fiber and laser. Fusible alloys represent a possible alternative material for anchoring a bared fiber, such material offering one advantage that it can be melted and solidified repeatedly. Fusible alloys are, however, not ideal for this purpose since, to melt the alloy heat must be applied so very close to the fiber and other elements inside the package that damage may result. Thus if a soldering iron is used and contact the fiber it can cause breakage and contamination. Moreover, it is difficult to control the temperature of miniature, heat sensitive parts such as the laser near a soldering iron tip.

It is now proposed that a thermoelectric device operable in one mode as a cooler and operable in another mode as a heater be substituted for the laser cooler of prior optical source packages. The thermoelectric device can be used in its heating mode to melt the fusible alloy prior to anchoring the fiber or when removing the fiber from the package and in its cooling mode to cool the laser during normal operation.

According to one aspect of the invention there is provided an electro-optic package comprising: a housing, a thermoelectric device within the housing and, mounted to the thermoelectric device, a light emitting source and a mass of fusible alloy, the thermoelectric device operable in one mode as a heater for melting the fusible alloy and operable in another mode as a cooler for cooling the light emitting device.

Preferably a portion of an optical fiber is anchored in the mass of fusible alloy in a position in which light emitted from the light emitting device is incident on an end surface of the fiber. The fusible alloy preferably has a melting point in the range 90°–100° C. The alloy can have a composition containing indium to give low melting point. The light emitting device, for example a laser diode or light emitting diode, preferably has a heat sink bonded to a surface of the thermoelectric device.

Preferably the operating modes of the thermoelectric device are related to current polarity through the device.

The housing preferably also contains a temperature sensor forming part of a feedback circuit controlling said thermoelectric device.

According to another aspect of the invention there is provided a method for anchoring an optical fiber in an electro-optic package housing a light emitting device, the package also housing a thermoelectric device operable in a first mode as a heater and operable in a second mode as a cooler to cool a light emitting device mounted thereon, and method comprising operating the thermoelectric device in said first mode while contacting the thermoelectric device with a low melting point fusible alloy to deposit molten fusible alloy on the thermoelectric device, leading one end of an optical fiber into the housing, manipulating the end portion to obtain a predetermined positional relationship between the fiber end surface and the light emitting device with part of the fiber end portion contacting the molten fusible alloy, and then discontinuing heating by said thermoelectric device whereby the solidify the fusible alloy and anchor the fiber end portion.

An embodiment of the invention will now be described by way of example with reference to the accompanying drawings in which:

FIG. 1 is a plane view of a package according to the invention;

FIG. 2 is a longitudinal sectional view of the FIG. 1 package; and

FIG. 3 shows a circuit schematic drawing of the FIG. 1 package.

Referring in detail to FIGS. 1 and 2, a laser package 10 has a semiconductor laser 12, for example, of the GaAlAs double heterostructure type mounted within a Kovar (RTM) housing 14. The laser 12 is mounted on a pedestal 16 forming part of a conducting metal heat sink 18. In front of the pedestal 16 a capillary break 20 extends across the heat sink 18 and behind the pedestal a ceramic substrate 22 is bonded to the heat sink. The heat sink 18 is mounted on a thermoelectric device 24 which can be operated both to heat and cool and upper surface 26 contacting the heat sink 18. A suitable subminiature thermoelectric device 24 is available from Melcor Materials Electronic Products Corporation under the specification number FS0.6-12-06L. The device 24 utilizes the Peltier effect and in both its heating and cooling modes is characterized by one surface being hot and the reverse surface being cold. The device, which measures only 0.24 inches × 0.16 inches × 0.11 inches, incorporates beryllia ceramic plates having the property of high electrical insulation with good thermal conductivity. To the ceramic substrate 22 are bonded a photodiode 28 and a temperature sensor 30 incorporating a thermistor. The photodetector 28 and the sensor 30 are addressed by contact pads 32 printed on the substrate 22. Leads 34 to all the electrical elements within the package 10 extend from pins 36 hermetically sealed into a wall 38 at feedthroughs 41. In an end wall 40 of the housing is mounted an optical fiber hermetic feedthrough 42. The feedthrough 42 and the nature of pin feedthroughs 41 are incidental to the present invention and so will not be described in detail. An end portion of an optical fiber 44, stripped of protective jacket, enters the package 10 at the optical feedthrough 42 and is anchored in place by a mass of fused alloy 46 sited on the heat sink 18 in front of the capillary break 20.

A preferred alloy is Indalloy No. 8, having a composition of 44% indium, 42% tin and 14% cadmium. The indium content ensures a relatively low melting point of 93° C.

As indicated previously the thermoelectric device can be operated as either a heater or cooler. A suitable circuit for driving the thermoelectric device in its heating mode to melt the fusible alloy is shown in FIG. 3. The package 10, indicated by a broken line, houses the thermoelectric device 24 and temperature sensor 30. The control circuit which is located outside the housing has a 5 volt supply which together with a controlling resistor R1 and voltage divider R2/R3 establishes a predetermined voltage at one terminal of a comparator 48. A variable resistor R4 and thermistor $R_t$ determine the voltage at the other terminal of the comparator 48. An output from the comparator is amplified by emitter follower and common emitter stages 50 and 52 respectively, and drives the thermoelectric device to heat its top surface 26. A threshold temperature in the package is set by resistor R4. The resistance of Rt increases as the temperature of surface 26 increases until the threshold is reached at which current to the thermoelectric device is stopped.

In the cooling mode the control circuit is replaced by another control circuit providing a fixed current of reverse polarity so as to cool the top surface 26. The thermistor $R_t$ is used in a feedback circuit to regulate the current supply to the laser 12.

When anchoring the optical fiber 44 to the top surface 26 of the device 24, the thermoelectric device is heated to about 110° C. and the Indalloy which has a melting point of 93° C. is deposited onto the top surface by rubbing with a piece of solid, fusable alloy. Flux, which is usually used to obtain wetting by a fusible alloy is undesirable since, in normal laser operation at high temperature it can volatilize and contaminate the laser or other elements in the package. By maintaining current through the thermoelectric device 24 a pool of molten solder is retained on the thermoelectric device top surface. The molten alloy is prevented from contacting the laser 12 or the fiber end face 54 by the capillary break 20.

With the optical fiber hermetic feedthrough 42 brazed onto the package wall 40, a projecting end portion of the fiber extends to just short of the laser site. The fiber end portion is then manipulated until the fiber end face 54 is at a position and orientation in which it receives a predetermined light output from the laser 12. Positioning of the fiber 44 is performed while the laser 12 is operating, light launched into the fiber from the laser being monitored at a remote end of the fiber. The temperature sensor meanwhile ensures that at no time during the heating cycle does the thermoelectric device top surface 26 reach such a high temperature that elements within the package 10 might be adversely affected or that solder used within the device 24 is melted. As soon as the fiber 44 is correctly positioned, current to the thermoelectric device is stopped to initiate cooling and subsequent alloy solidification to anchor the fiber 44 in place.

What is claimed is:

1. An electro-optic package comprising:
   a housing containing a thermoelectric device, a thermally conducting block contacting a thermoelectric device, and a light emitting device and a mass of fusible alloy supported on the block, the light emitting device spaced from the mass of fusible alloy, the thermoelectric device operable in one mode when a voltage of one polarity is applied thereto to heat and thereby melt the fusible alloy and operable in another mode when a voltage of reverse polarity is applied thereto to cool the light emitting device.

2. An electro-optic package as claimed in claim 1, in which a portion of an optical fiber is anchored in said mass of fusible alloy in a position in which an end surface of the fiber is exposed and an emitting region of the light emitting device faces an end surface of the fiber.

3. An electro-optic package as claimed in claim 1, in which the fusible alloy has a melting point in the range 85° C. to 100° C.

4. An electro-optic package as claimed in claim 3, in which the fusible alloy contains indium.

5. An electro-optic package as claimed in claim 1, in which the thermoelectric device is a Peltier effect device.

6. An electro-optic package as claimed in claim 1, in which the housing also contains a thermister connected to terminals of the package for monitoring temperature in the package.

7. An electro-optic package as claimed in claim 6, in which the temperature sensor includes a thermistor contacting said thermoelectric device surface.

8. An electro-optic package as claimed in claim 6, in which the temperature sensor is one element of an electrical sensing circuit, the electrical sensing circuit having an output to a feedback loop, the output of the feedback loop controlling the thermoelectric device.

9. An electro-optic package as claimed in claim 1, in which the housing is hermetically sealed.

10. An electro-optic package as claimed in claim 1 in which the block has a step therein, the light emitting device mounted above the step and the mass of alloy positioned below it.

11. An electro-optic package as claimed in claim 10 in which a channel extends into the block at a base of the step.

12. A method of operating a thermoelectric device functioning as a heater when a voltage of a first polarity is applied thereto and functioning as a cooler when a voltage of reverse polarity is applied thereto, said thermoelectric device housed within an electro-optic package which also houses a light emitting device, the light emitting device being mounted in thermally conducting relationship to the thermoelectric device, the method comprising:
   operating the thermoelectric device in a heating mode to melt a mass of low melting point alloy supported thereon whereby to convert said mass to molten alloy, leading one end of an optical fiber into the package, manipulating the fiber end to obtain a predetermined positional relationship between the fiber end surface and the light emitting device with part of the fiber end portion within the molten alloy, discontinuing heating whereby to solidify the molten alloy and thereby anchor the fiber end and subsequently, in operating the light emitting device, applying a voltage of reverse polarity to the thermoelectric device thereby to cool the light emitting device.

* * * * *